(12) United States Patent
Nakashima et al.

(10) Patent No.: US 11,821,915 B2
(45) Date of Patent: Nov. 21, 2023

(54) SOCKET FOR INSPECTION

(71) Applicant: Yamaichi Electronics Co., Ltd., Tokyo (JP)

(72) Inventors: Kouki Nakashima, Tokyo (JP); Katsumi Suzuki, Tokyo (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 17/454,640

(22) Filed: Nov. 12, 2021

(65) Prior Publication Data

US 2022/0155343 A1 May 19, 2022

(30) Foreign Application Priority Data

Nov. 17, 2020 (JP) ................................ 2020-190863

(51) Int. Cl.
*G01R 1/04* (2006.01)
*H01R 12/70* (2011.01)
*H01R 13/24* (2006.01)
*H01R 12/71* (2011.01)

(52) U.S. Cl.
CPC ....... *G01R 1/0466* (2013.01); *H01R 12/7076* (2013.01); *H01R 12/714* (2013.01); *H01R 13/2407* (2013.01); *H01R 2201/20* (2013.01)

(58) Field of Classification Search
CPC ............. G01R 1/0466; H01R 12/7076; H01R 12/714; H01R 13/2407; H01R 2201/20
USPC ....................................................... 439/700
See application file for complete search history.

(56) References Cited

U.S. PATENT DOCUMENTS

| | | | | |
|---|---|---|---|---|
| 3,011,005 A | * | 11/1961 | Silver | .................... G01K 7/025 374/E7.006 |
| 4,528,500 A | * | 7/1985 | Lightbody | ......... H01R 13/2421 324/537 |
| 6,293,809 B1 | * | 9/2001 | Shimada | .............. H05K 7/1084 439/71 |
| 6,503,089 B2 | * | 1/2003 | Saijo | .................... H05K 7/1069 439/70 |

(Continued)

FOREIGN PATENT DOCUMENTS

EP 1607749 A2 * 12/2005 ........... G01R 1/0466
JP 2000340326 A * 12/2000

(Continued)

*Primary Examiner* — Peter G Leigh
(74) *Attorney, Agent, or Firm* — Hamilton, Brook, Smith & Reynolds, P.C.

(57) ABSTRACT

Provided is a socket for inspection that can correct inclination of a terminal in contact with a device under inspection to stabilize the terminal-to-electrode contact. The socket includes: a contact terminal having a barrel with a flange, a device side terminal, a test board side terminal, and a spring; a housing having a stepped hole through which the contact terminal is inserted and in which a step that abuts against the flange is axially formed; and a movable pedestal provided so as to move closer to and away from the housing and having a receiving hole through which a distal end side of the device side terminal projecting from the barrel is inserted and which receives an electrode of the device. A guide part whose inner diameter is substantially the same as the outer diameter of a projecting portion of the device side terminal is formed in the receiving hole.

6 Claims, 18 Drawing Sheets

(56) References Cited

U.S. PATENT DOCUMENTS

| | | | | |
|---|---|---|---|---|
| 6,559,665 B1 * | 5/2003 | Barabi | ............... | H01L 24/72 |
| | | | | 324/754.08 |
| 6,685,492 B2 * | 2/2004 | Winter | ............... | G01R 1/0466 |
| | | | | 324/755.05 |
| 6,758,682 B1 * | 7/2004 | Kosmala | ............... | H01R 13/2421 |
| | | | | 439/700 |
| 6,844,749 B2 * | 1/2005 | Sinclair | ............... | G01R 1/06722 |
| | | | | 324/755.05 |
| 6,860,742 B2 * | 3/2005 | Shimada | ............... | H01R 12/7076 |
| | | | | 439/70 |
| 6,861,862 B1 * | 3/2005 | Tate | ............... | G01R 1/0483 |
| | | | | 439/700 |
| 6,902,410 B2 * | 6/2005 | Watanabe | ............... | H01R 12/714 |
| | | | | 439/73 |
| 6,937,045 B2 * | 8/2005 | Sinclair | ............... | G01R 1/0483 |
| | | | | 324/755.05 |
| 6,992,496 B2 * | 1/2006 | Winter | ............... | G01R 1/0441 |
| | | | | 324/756.07 |
| 7,134,892 B2 * | 11/2006 | Hayakawa | ............... | H05K 7/1084 |
| | | | | 439/268 |
| 7,367,813 B2 * | 5/2008 | Matsuo | ............... | G01R 1/0466 |
| | | | | 439/700 |
| 7,381,062 B2 * | 6/2008 | Shimada | ............... | G01R 1/06722 |
| | | | | 439/700 |
| 7,393,232 B2 * | 7/2008 | Morinari | ............... | G01R 1/0408 |
| | | | | 439/71 |
| 7,407,401 B1 * | 8/2008 | Morinari | ............... | G01R 1/0466 |
| | | | | 439/331 |
| 8,083,552 B2 * | 12/2011 | Oishi | ............... | H01R 13/2421 |
| | | | | 439/700 |
| 8,556,639 B2 * | 10/2013 | Ueyama | ............... | H01R 12/91 |
| | | | | 439/700 |
| 9,105,994 B2 * | 8/2015 | Suzuki | ............... | G01R 1/06738 |
| 10,161,964 B2 * | 12/2018 | Miyagawa | ............... | G01R 1/0466 |
| 2003/0124895 A1 * | 7/2003 | Winter | ............... | H01R 13/2421 |
| | | | | 439/219 |
| 2006/0228914 A1 * | 10/2006 | Oda | ............... | H01R 13/2421 |
| | | | | 439/71 |
| 2008/0048701 A1 * | 2/2008 | Henry | ............... | G01R 1/06722 |
| | | | | 324/755.05 |
| 2015/0369859 A1 * | 12/2015 | Suzuki | ............... | G01R 1/067 |
| | | | | 324/755.08 |
| 2020/0006882 A1 * | 1/2020 | Isagoda | ............... | G01R 1/06738 |

FOREIGN PATENT DOCUMENTS

| | | | | |
|---|---|---|---|---|
| JP | 2001326048 A | * | 11/2001 | |
| JP | 2001326048 A | | 11/2001 | |
| JP | 2006269366 A | * | 10/2006 | |
| JP | 2007200583 A | * | 8/2007 | |
| JP | 2013113753 A | * | 6/2013 | ........... G01R 1/0483 |
| JP | 2013140059 A | * | 7/2013 | |
| JP | 2015125971 A | * | 7/2015 | |
| JP | 5847576 B2 | * | 1/2016 | |
| JP | 2016008835 A | * | 1/2016 | ............. G01R 1/073 |
| JP | 2020153723 A | * | 9/2020 | |
| WO | WO-9713301 A1 | * | 4/1997 | ........... G01R 1/0483 |
| WO | WO-2013080675 A1 | * | 6/2013 | ........... G01R 1/0483 |
| WO | WO-2013100064 A1 | * | 7/2013 | ........... G01R 1/0466 |
| WO | WO-2018092909 A1 | * | 5/2018 | ........... G01R 1/0441 |

* cited by examiner

SOCKET FOR INSPECTION

RELATED APPLICATION

This application claims priority under 35 U.S.C. § 119 or 365 to Japanese Application No. 2020-190863, filed Nov. 17, 2020. The entire teachings of the above application are incorporated herein by reference.

FIELD OF THE INVENTION

The present invention relates to a socket for inspection.

DESCRIPTION OF RELATED ART

In general, for electronic devices such as an IC package to be mounted on electronics or the like, a socket for inspection is used to perform a test for removing a potential defect of such an electronic device before the electronic device is mounted on a wiring board. The socket for inspection is attached to a printed wiring board that is a test board or a circuit board.

As a socket as described above, for example, Japanese Patent Application Laid-Open No. 2001-326048 discloses a socket with a movable pedestal. The socket with a movable pedestal disclosed in Japanese Patent Application Laid-Open No. 2001-326048 is configured such that a solder ball of a package and a terminal of a probe come into contact with each other in a through hole formed in the movable pedestal (fourth base).

Japanese Patent Application Laid-Open No. 2001-326048 is an example of the related art.

In the configuration of Japanese Patent Application Laid-Open No. 2001-326048, however, the terminal of the probe may be inclined in the through hole formed in the fourth base, and this may cause a contact failure between the terminal and the solder ball or damage on the terminal.

Accordingly, the present invention intends to provide a socket for inspection that can correct inclination of a terminal in contact with a device to be inspected and thereby stabilize the contact between the terminal and an electrode.

BRIEF SUMMARY OF THE INVENTION

To solve the problem described above, the socket for inspection of the present invention employs the following solutions.

That is, a socket for inspection according to one aspect of the present invention includes: a contact terminal having a barrel formed of a cylindrical member extending along an axis line direction and provided with a flange formed of an outer circumferential surface of the cylindrical member protruding in a radial direction, a device side terminal having a base end accommodated in one end side of the barrel and a distal end configured to come into contact with a device to be inspected, a test board side terminal having a base end accommodated in the other end side of the barrel and a distal end configured to come into contact with a test board, and a spring in contact with the test board side terminal and the device side terminal in the barrel; a housing having a stepped hole through which the contact terminal is inserted along the axis line direction and in which a step configured to abut against the flange in the axis line direction is formed; and a movable pedestal provided so as to be able to come closer to and move away from the housing and having a receiving hole through which a distal end side of the device side terminal projecting from the barrel is inserted and which receives an electrode of the device to be inspected. A guide part is formed in the receiving hole of the movable pedestal, and the guide part has an inner diameter that is substantially the same as an outer diameter of a portion of the device side terminal projecting from the barrel.

According to the socket for inspection according to the present aspect, the socket includes a so-called both-movable type contact terminal having a barrel provided with a flange, a device side terminal, a test board side terminal, and a spring; a housing having a stepped hole through which a contact terminal is inserted and in which a step configured to abut against the flange in the axis line direction is formed; and a movable pedestal provided so as to be able to come closer to and move away from the housing and having a receiving hole through which a distal end side of the device side terminal projecting from the barrel is inserted and which receives an electrode of a device to be inspected. Therefore, the barrel including the whole flange is pushed down by the stepped hole formed in the housing, and thereby, a preload can be applied to the test board. At this time, the position of the step in the stepped hole does not depend on the longitudinal dimension of the barrel. Thus, by adjusting the position of the step to a desired position, it is possible to increase the housing thickness dimension (dimension along the axis line direction) of a portion to press the flange. This can suppress the housing from deforming due to reaction force against the preload. Further, since the position of the step in the stepped hole corresponds to the position of the flange and does not depend on the longitudinal dimension of the barrel, it is possible to reduce the thickness of the housing and increase the thickness dimension of the movable pedestal accordingly. Thus, a sufficient thickness to form a guide part described below can be ensured for the movable pedestal.

In this state, since the guide part whose inner diameter is substantially the same as the outer diameter of the portion of the device side terminal projecting from the barrel is formed in the receiving hole of the movable pedestal, inclination of the device side terminal can be corrected. This can stabilize contact between the device side terminal and the electrode (for example, a solder ball) in the receiving hole.

Further, in the socket for inspection according to one aspect of the present invention, a counterbore that receives the barrel projecting from the housing is formed in the receiving hole of the movable pedestal.

According to the socket for inspection according to the present aspect, since a counterbore that receives the barrel projecting from the housing is formed in the receiving hole of the movable pedestal, it is possible to avoid interference between the barrel and the movable pedestal that may occur when the movable pedestal comes close to the housing.

Further, in the socket for inspection according to one aspect of the present invention, the counterbore is formed integrally and continuously with another counterbore adjacent to the counterbore.

According to the socket for inspection according to the present aspect, since the counterbore is formed integrally and continuously with adjacent another counterbore, a plurality of counterbores can be formed together at once. Accordingly, the counterbores can be efficiently formed.

Further, in the socket for inspection according to one aspect of the present invention, the movable pedestal is divided in the axis line direction.

According to the socket for inspection according to the present aspect, since the movable pedestal is divided in the axis line direction, it is possible to form one movable pedestal by combining back surfaces of two components to each other that have been processed from the front surfaces, for example, without performing processing such as drilling from both the surfaces on one component forming one movable pedestal.

Further, in the socket for inspection according to one aspect of the present invention, an expanded-diameter terminal part having substantially the same diameter as the barrel is provided to a distal end in the device side terminal.

According to the socket for inspection according to the present aspect, since the expanded-diameter terminal part having substantially the same diameter as the barrel is provided to the distal end in the device side terminal, the guide part and the counterbore formed in the receiving hole can be formed as the same portion. Further, during inspection, the contact terminal has substantially the same diameter as a whole, and impedance mismatch can be removed.

Further, in the socket for inspection according to one aspect of the present invention, an expanded-diameter terminal part having substantially the same diameter as the barrel is provided to distal ends in the device side terminal and the test board side terminal.

According to the socket for inspection according to the present aspect, since the expanded-diameter terminal part having substantially the same diameter as the barrel is provided to the distal end in the device side terminal, the guide part and the counterbore formed in the receiving hole can be formed as the same portion. Further, during inspection, the contact terminal has substantially the same diameter as a whole, and impedance mismatch can be removed.

Further, since the expanded-diameter terminal part having substantially the same diameter as the barrel is provided at the distal end also in the test board side terminal, impedance mismatch can be removed during inspection.

Further, in the socket for inspection according to one aspect of the present invention, the device side terminal is set to have a longitudinal dimension so that the expanded-diameter terminal part comes into contact with the one end of the barrel during inspection.

According to the socket for inspection according to the present aspect, since the device side terminal is set to have a longitudinal dimension so that the expanded-diameter terminal part abuts against the one end of the barrel during inspection, the expanded-diameter terminal part is stably in contact with the end of the barrel during inspection. This can stabilize the contact resistance between the device side terminal and the barrel. Note that, since the contact terminal is a so-called both-movable type, even when the barrel is further pushed into while the expanded-diameter terminal part abuts against the end of the barrel, a displacement due to the pushing can be absorbed on the test board side terminal side.

Further, according to such a configuration, the portion except for the expanded-diameter terminal part of the device side terminal is entirely accommodated in the barrel (hidden in appearance) during inspection. Thus, during inspection, the contact terminal has substantially the same diameter as a whole, and impedance mismatch can be further removed.

According to the present invention, it is possible to correct inclination of a terminal in contact with a device to be inspected and thereby stabilize the contact between the terminal and an electrode.

BRIEF DESCRIPTION OF THE SEVERAL
VIEWS OF THE DRAWINGS

DETAILED DESCRIPTION OF THE
INVENTION

First Embodiment

A socket for inspection according to a first embodiment of the present invention will be described below with reference to the drawings.

[Overview of Socket]

Figure 1:
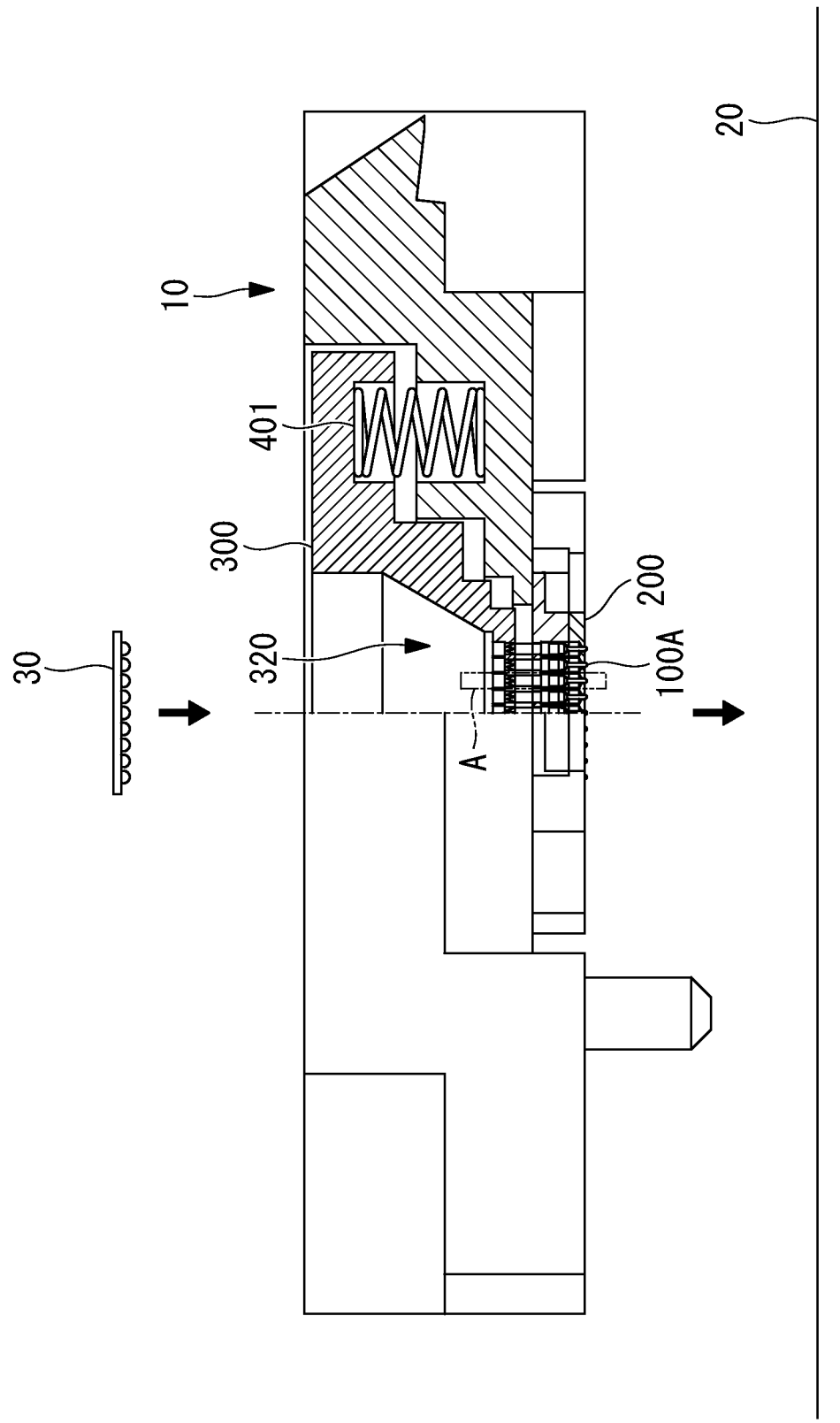
FIG. 1 illustrates a front view and a vertical sectional view of a socket for inspection according to a first embodiment.

FIG. 1 illustrates a front view and a vertical sectional view of the socket for inspection 10 (hereafter, simply referred to as "socket 10").

The socket 10 is a component that causes a printed wiring board 20 and an IC package 30 to be conducted to each other in a test of the IC package 30. The socket 10 is mounted on the upper surface of the printed wiring board 20 as a test board, for example. Further, for example, the IC package 30 as a device to be inspected is attached to a recess 320 of the socket 10 mounted on the printed wiring board 20.

An example of the IC package 30 may be a Ball Grid Array (BGA) type IC package. Further, a Land Grid Array (LGA) type or a Quad Flat Package (QFP) type IC package may be employed.

The socket 10 has contact probes (contact terminals) 100A, a housing 200, and a movable pedestal 300. In the socket 10, the housing 200 is arranged on the printed wiring board 20 side, and the movable pedestal 300 is arranged so as to be stacked thereon.

A spring for pedestal 401 is interposed between the housing 200 and the movable pedestal 300 and pushes both the members in directions away from each other. This enables the movable pedestal 300 to elastically come closer to or move away from the housing 200.

In details, the movable pedestal 300 moves away from the housing 200 when no load is applied, and the movable pedestal 300 comes closer to the housing 200 when the movable pedestal 300 is pushed toward the housing 200 side.

A plurality of contact probes 100A are erected and accommodated between the housing 200 and the movable pedestal 300 configured as described above.

These contact probes 100A are used to have conduction between the IC package 30 attached to the socket 10 and the printed wiring board 20 on which the socket 10 is mounted.

[Details of Contact Probe]

Figure 2:
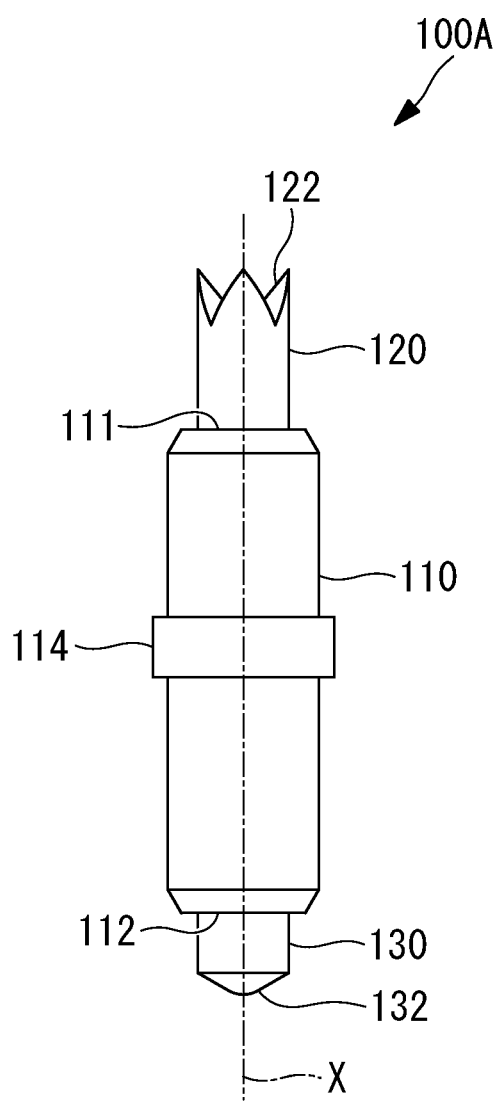
FIG. 2 is a front view of a contact probe according to the first embodiment.
Figure 3:
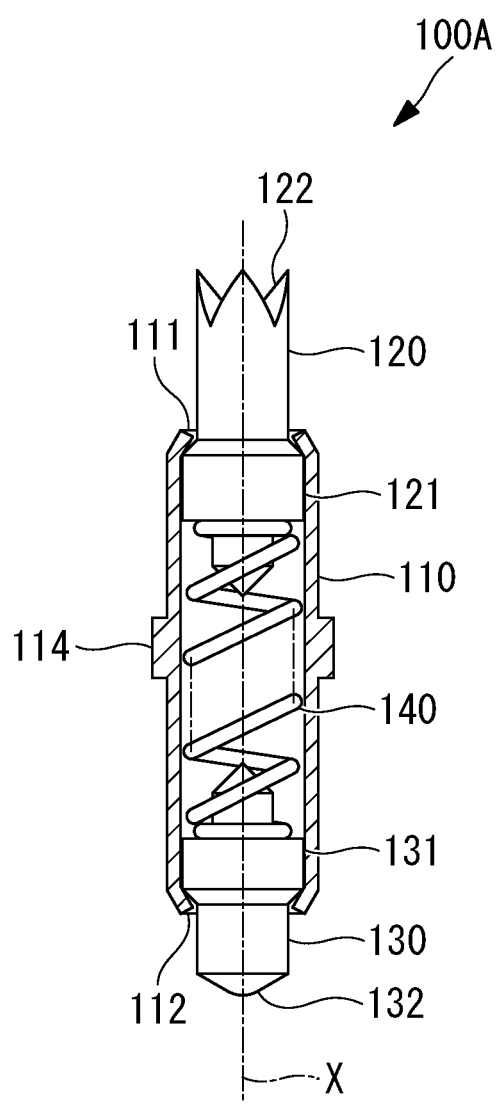
FIG. 3 is a vertical sectional view of the contact probe according to the first embodiment.

As illustrated in FIG. 2 and FIG. 3, each contact probe 100A is a so-called both-movable type probe having a barrel 110, an upper plunger (device side terminal) 120, a lower plunger (test board side terminal) 130, and a spring 140.

The contact probe 100A has a probe length of about 3 mm, for example, when no load is applied.

The barrel 110 is a thin cylindrical member extending in the axis line X direction, and a space for accommodating a base end 121 of the upper plunger 120, a base end 131 of the lower plunger 130, and a spring 140 is formed inside the barrel 110.

A crimped part tapered inward in the radial direction is formed at each of an upper end (one end) 111 and a lower end (the other end) 112 of the barrel 110.

Note that "radial direction" as used herein refers to a direction with respect to the axis line X.

As illustrated in FIG. 2 to FIG. 5, a flange 114 protruding outward in the radial direction from the outer circumferential surface of the cylindrical member is formed between the upper end 111 and the lower end 112 of the barrel 110. The position of the flange 114 corresponds to the position of a step 211 formed in a stepped hole 210 described later.

Figure 4:
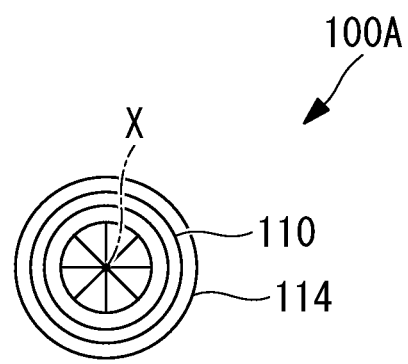
FIG. 4 is a plan view of the contact probe according to the first embodiment.
Figure 5:
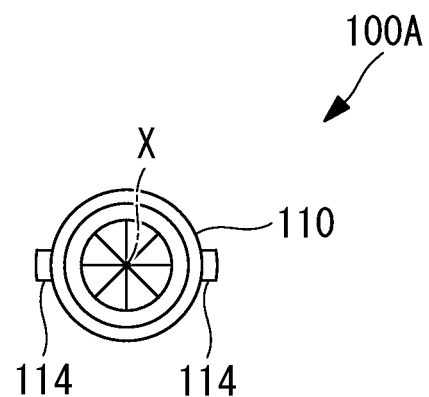
FIG. 5 is a plan view of the contact probe according to the first embodiment.

The flange 114 may be formed over the whole range in the circumferential direction (360 degrees) as illustrated in FIG. 4 or may be formed to only a partial range in the circumferential direction as illustrated in FIG. 5. Further, since the flange 114 is a portion formed for abutting against the step 211 formed in the stepped hole 210 described later, the flange 114 may be of other forms than those illustrated in FIG. 4 and FIG. 5 as long as the above function is achieved.

Note that "circumferential direction" as used herein refers to a direction with respect to the axis line X.

As illustrated in FIG. 3, the upper plunger 120 is substantially a columnar terminal having the base end 121 and the distal end 122.

The base end 121 side has substantially the same diameter as (to be exact, a diameter slightly smaller than) the inner diameter of the barrel 110 and is accommodated in the barrel 110. On the other hand, the distal end 122 side has a smaller diameter than the base end 121 and projects from the upper end 111 of the barrel 110 when no load is applied. The distal end 122 is cut in a manner of so-called crown cut, and a solder ball (electrode) 31 of the IC package 30 comes into contact therewith.

In the upper plunger 120, the boundary between a portion on the base end 121 side and a portion on the distal end 122 side (the portion where the outer diameter changes) abuts against the crimped part at the upper end 111 of the barrel 110, and thereby, the upper plunger 120 that moves forward and backward relative to the barrel 110 does not fall out of the barrel 110.

The lower plunger 130 is substantially a columnar terminal having the base end 131 and the distal end 132.

The base end 131 side has substantially the same diameter as (to be exact, a diameter slightly smaller than) the inner diameter of the barrel 110 and is accommodated in the barrel 110. On the other hand, the distal end 132 side has a smaller diameter than the base end 131 and projects from the lower end 112 of the barrel 110 when no load is applied. The distal end 132 to be in contact with the printed wiring board 20 has a rounded shape.

In the lower plunger 130, the boundary between a portion on the base end 131 side and a portion on the distal end 132 side (the portion where the outer diameter changes) abuts against the crimped part at the lower end 112 of the barrel 110, and thereby, the lower plunger 130 that moves forward and backward relative to the barrel 110 does not fall out of the barrel 110.

The spring 140 is accommodated inside the barrel 110.

The spring 140 is interposed between the base end 121 of the upper plunger 120 and the base end 131 of the lower plunger 130 and pushes both the members in directions away from each other in the axis line X direction. Thereby, when no load is applied, the upper plunger 120 abuts against the crimped part at the upper end 111 of the barrel 110, and the lower plunger 130 abuts against the crimped part provided at the lower end 112 of the barrel 110.

Further, by the upper plunger 120 and/or the lower plunger 130 being pushed in a direction to be closer to each other, repulsive force due to the elastic force of the spring 140 works between the upper plunger 120 and the lower plunger 130.

[Details of Housing]

Figure 6:
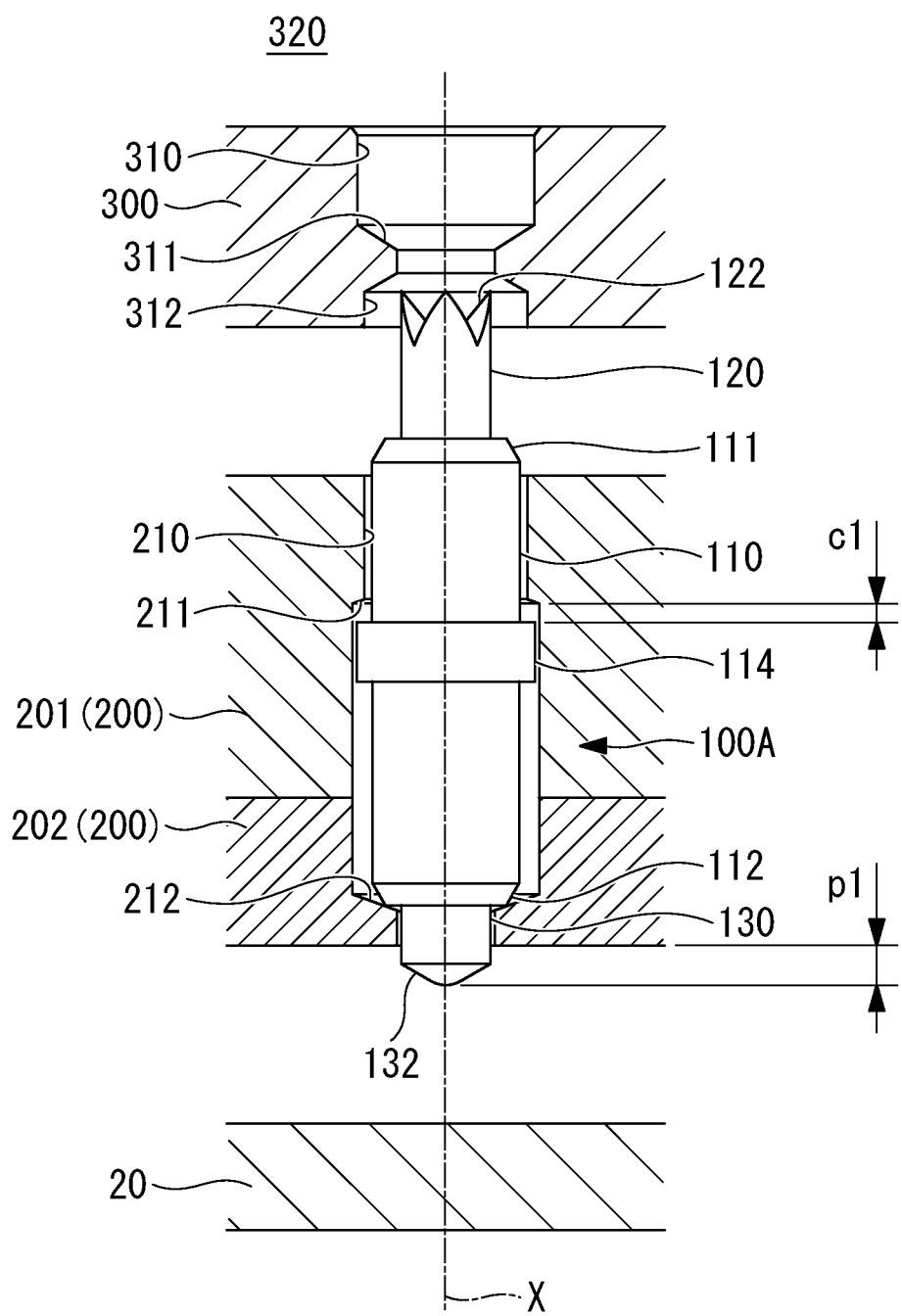
FIG. 6 is a partial enlarged view of a part A illustrated in FIG. 1, which is a diagram illustrating a state before a socket is mounted on a printed wiring board.

As illustrated in FIG. 6, the housing 200 is divided into two components of an upper housing 201 and a lower housing 202 in the axis line X direction and formed such that the stepped hole 210 through which the contact probe 100A is inserted along the axis line X direction is continuous over both the components of the upper housing 201 and the lower housing 202.

The step 211 is formed in the stepped hole 210 hollowed in the upper housing 201. In the stepped hole 210, the inner diameter of the stepped hole 210 above the step 211 is smaller than the inner diameter of the stepped hole 210 below the step 211.

In details, the inner diameter of the stepped hole 210 above the step 211 is smaller than the outer diameter of the flange 114 formed on the barrel 110 and larger than the outer diameter of other portions than the flange 114 of the barrel 110. In contrast, the inner diameter of the stepped hole 210 below the step 211 is larger than the outer diameter of the flange 114 formed on the barrel 110. This allows the flange 114 to abut against the step 211 (see FIG. 7).

Figure 7:
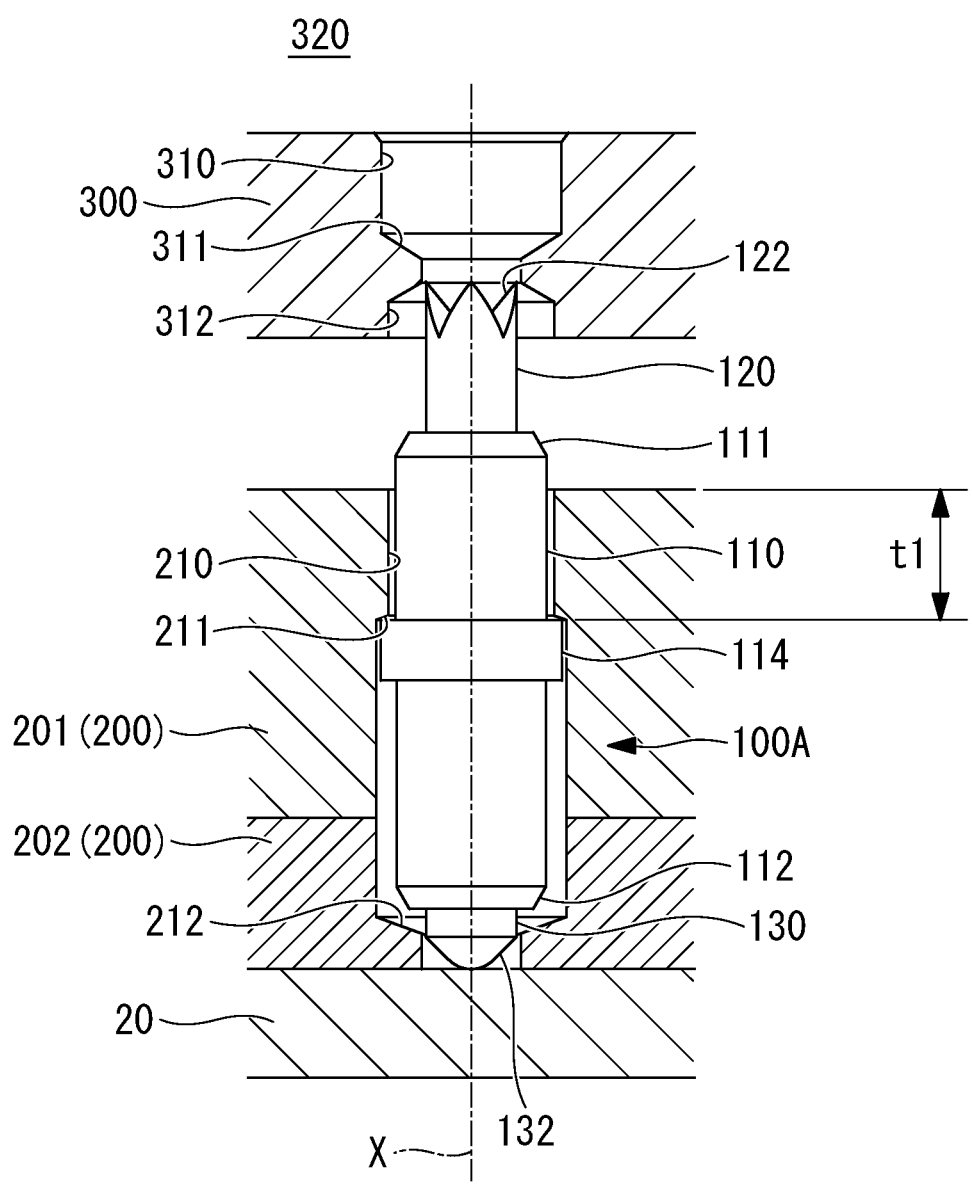
FIG. 7 is a partial enlarged view of the part A illustrated in FIG. 1, which is a diagram illustrating a state after the socket has been mounted on the printed wiring board and before an IC package is placed on a movable pedestal.

As illustrated in FIG. 7, the step 211 is a portion used for pushing the contact probe 100A (the barrel 110) toward the printed wiring board 20 side when a preload is applied. That is, reaction force against the preload works on the housing 200 above the step 211 (the upper housing 201). Thus, with the thickness dimension of the housing 200 above the step 211 being suitably secured, warping (deformation) due to the reaction force against the preload can be suppressed. In other words, the position of the step 211 (the position along the axis line X direction, the position in the thickness direction) can be set so that the strength of the housing 200 is ensured.

Further, it is possible to adjust the thickness dimension of the housing 200 (the upper housing 201) by the position of the step 211. It is therefore possible to reduce the thickness of the housing 200 as small as possible while ensuring the strength and increase the thickness of the movable pedestal 300 accordingly. Thus, a sufficient thickness dimension for forming a guide part 311 described later can be secured in the movable pedestal 300.

As illustrated in FIG. 6, a reduced-diameter part 212 is formed in the stepped hole 210 hollowed in the lower housing 202.

The inner diameter of the reduced-diameter part 212 is smaller than the outer diameter of the barrel 110 and substantially the same as (to be exact, slightly larger than) the portion projecting from the barrel 110 of the lower plunger 130. This prevents the contact probe 100A from falling out of the stepped hole 210.

With the configuration described above, the housing 200 is configured to receive and hold the contact probe 100A by the stepped hole 210.

Note that the housing 200 may be formed of three or more divisions.

[Details of Movable Pedestal]

As illustrated in FIG. 1, a recess 320 in which the IC package 30 is placed and attached is formed in the movable pedestal 300.

As illustrated in FIG. 6, a receiving hole 310 is formed along the axis line X direction in the recess 320 in the movable pedestal 300.

Figure 8:
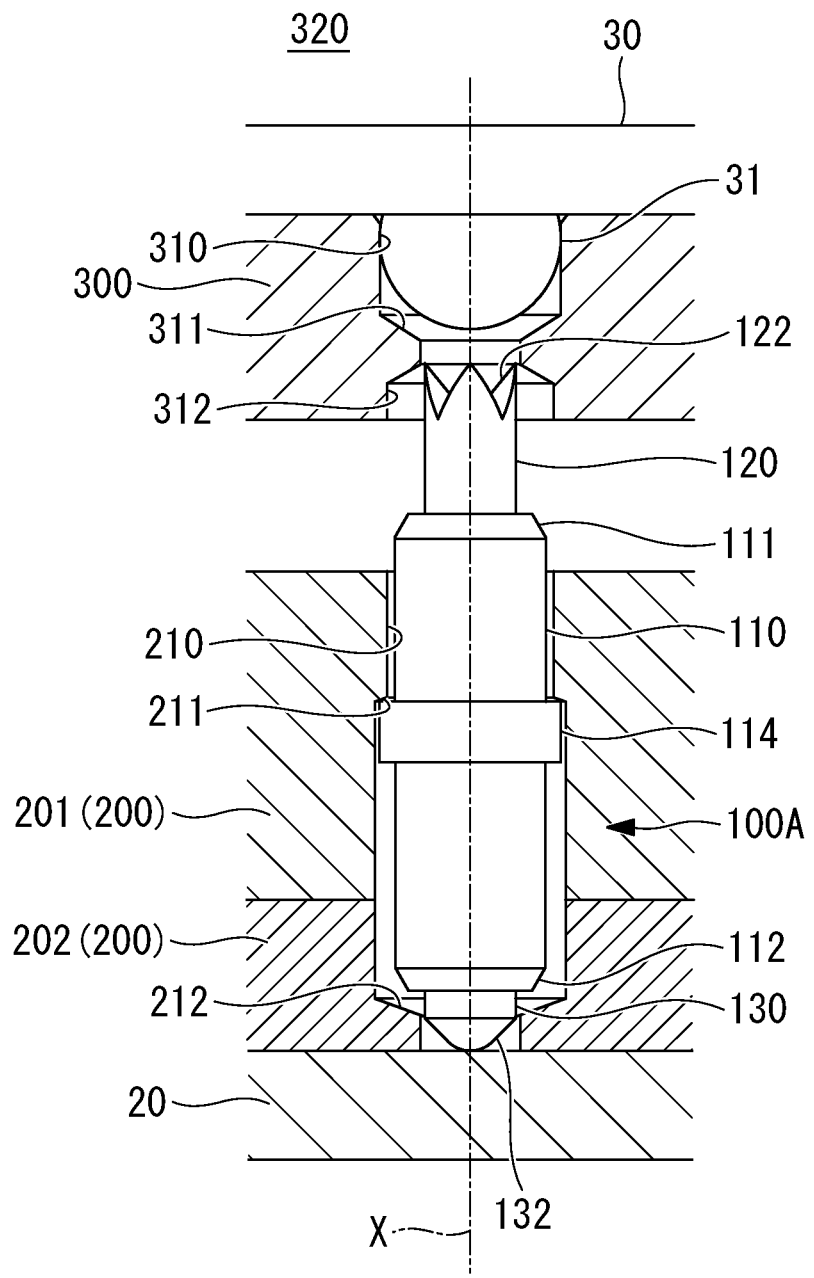
FIG. 8 is a partial enlarged view of the part A illustrated in FIG. 1, which is a diagram illustrating a state after the socket has been mounted on the printed wiring board and the IC package has been placed on the movable pedestal.
Figure 9:
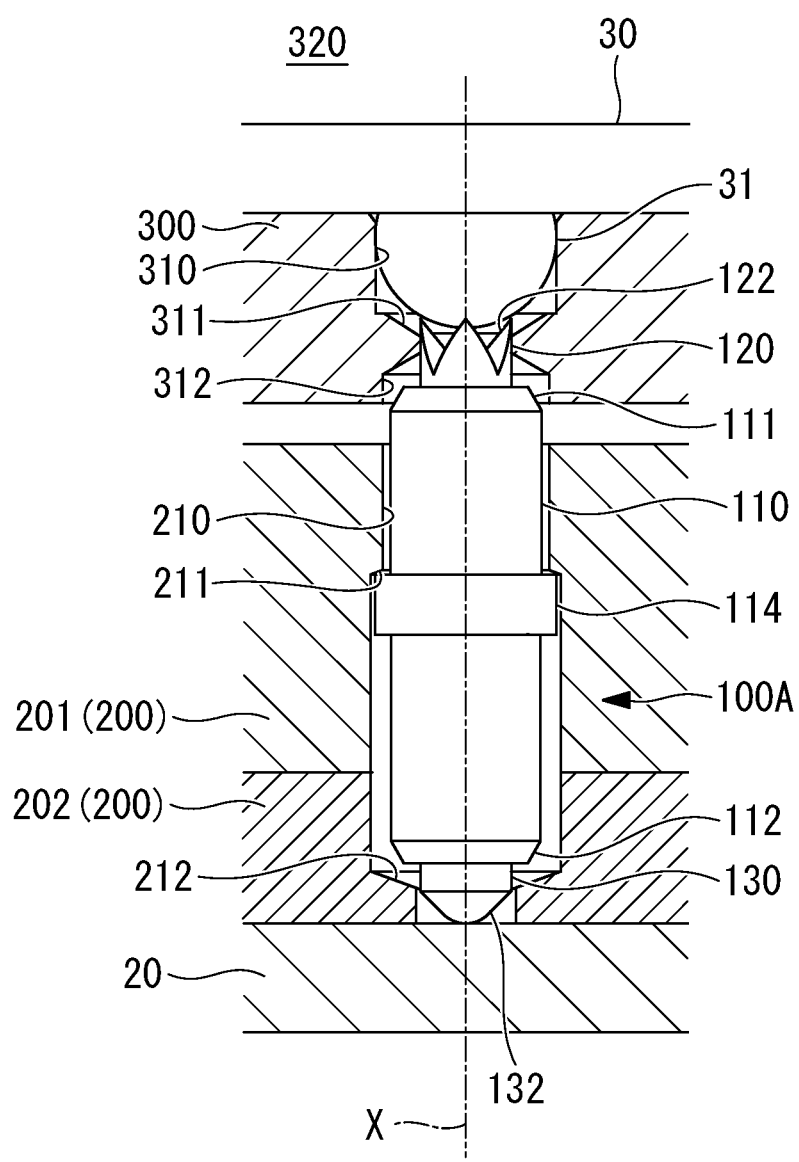
FIG. 9 is a partial enlarged view of the part A illustrated in FIG. 1, which is a diagram illustrating a state after the socket has been mounted on the printed wiring board and the IC package has been attached to the movable pedestal.

The distal end 122 side of the upper plunger 120 is inserted through the receiving hole 310, and the solder ball 31 of the IC package 30 placed on the movable pedestal 300 is received therein (see FIG. 8 and FIG. 9). Further, the solder ball 31 is positioned by the receiving hole 310.

As illustrated in FIG. 6, the guide part 311 and a counterbore 312 are formed in the receiving hole 310 hollowed in the movable pedestal 300.

The guide part 311 is a portion formed between the upper part and the lower part of the receiving hole 310, and the inner diameter thereof is substantially the same as (to be exact, slightly larger than) the thickest portion in the portion of the upper plunger 120 projecting from the barrel 110. Accordingly, the portion of the upper plunger 120 projecting from the barrel 110 can be guided. The inner diameter of the guide part 311 does not depend on the size of the solder ball 31.

The counterbore 312 is a portion formed in the lower part of the receiving hole 310 and is a portion to receive the barrel 110 projecting from the upper housing 201 (see FIG. 9).

Figure 10:
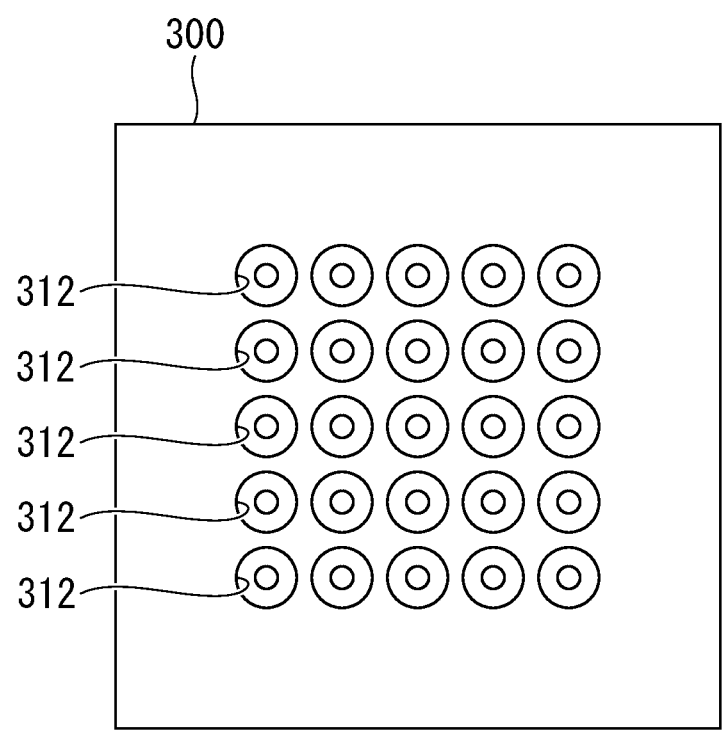
FIG. 10 is a bottom view of the movable pedestal illustrating a counterbore according to the first embodiment.

As illustrated in FIG. 10, the counterbore 312 is formed in a circular shape in the bottom surface of the movable pedestal 300. In such a case, one counterbore 312 is formed for one receiving hole 310.

Figure 11:
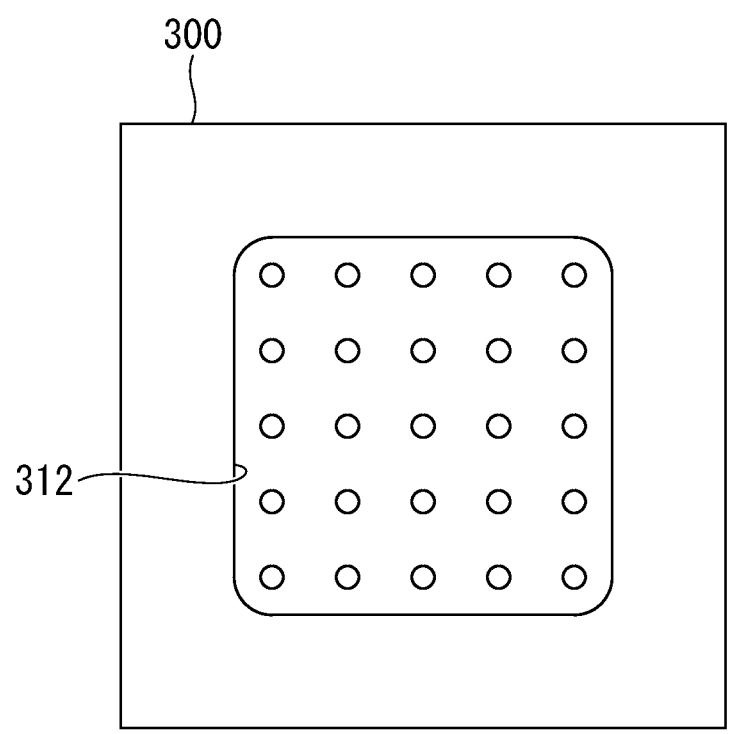
FIG. 11 is a bottom view of another movable pedestal illustrating a counterbore.
Figure 12:
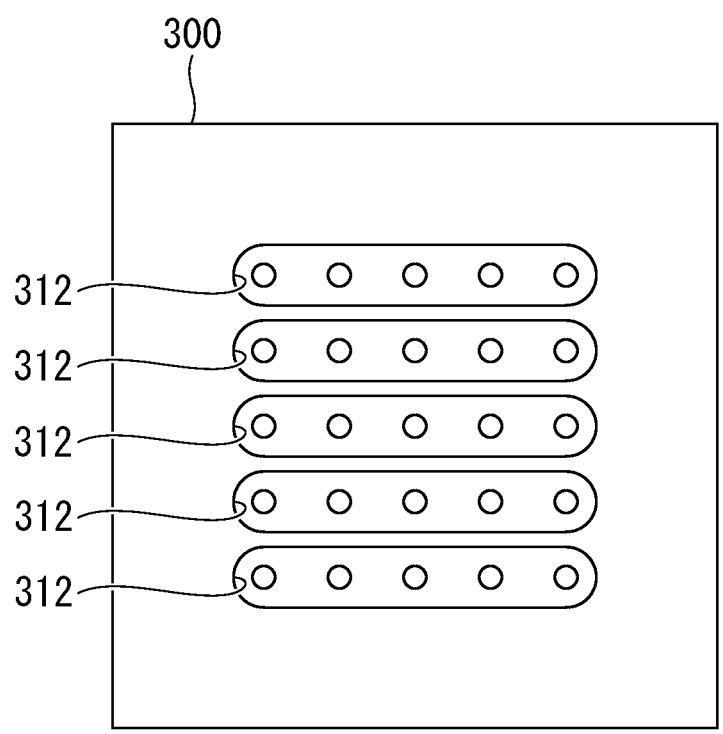
FIG. 12 is a bottom view of another movable pedestal illustrating a counterbore.

Note that the counterbore 312 is not necessarily required to be in one-to-one relationship with the receiving hole 310, and adjacent counterbores 312 may be integrally and continuously formed. For example, the counterbore may be only one recess formed for all the receiving holes 310 as illustrated in FIG. 11 or may include long narrow slit-like counterbores formed over a plurality of lines as illustrated in FIG. 12.

[Use of Socket]

The socket 10 configured as described above is used as follows.

That is, as illustrated in FIG. 6 and FIG. 7, first, the socket 10 is mounted on the printed wiring board 20. Before the socket 10 is mounted (FIG. 6), the distal end 132 of the lower plunger 130 projects from the lower housing 202 (projection length is denoted as p1). Further, a clearance c1 is provided between the flange 114 and the step 211. Further, the longitudinal dimension of the lower plunger 130, the position of the step 211, and the position of the flange 114 are set so that p1>c1 is met.

The distal end 132 of the lower plunger 130, which has projected from the lower housing 202 before the socket 10 is mounted (FIG. 6), is in contact with the printed wiring board 20 after the socket 10 is mounted (FIG. 7). At the same time, the contact probe 100A is lifted upward. When the contact probe 100A is lifted upward by c1, the upper face of the flange 114 abuts against the step 211.

At this time, since p1>c1 is met, the lower plunger 130 is pushed into the barrel 110 by p1-c1 when the under surface of the lower housing 202 and the upper surface of the printed wiring board 20 are in contact with each other. In this state, the lower plunger 130 is pushed by the spring 140, and thereby, a preload is applied to the printed wiring board 20. Further, the reaction force against the preload is suppressed by a portion of the upper housing 201 (denoted as the thickness μl) above the step 211.

As illustrated in FIG. 8, after the socket 10 is mounted on the printed wiring board 20, the IC package 30 is placed on the bottom face of the recess 320 formed in the movable pedestal 300. At this time, the solder ball 31 of the IC package 30 is received by the receiving hole 310 formed in the movable pedestal 300. However, the solder ball 31 is still not in contact with the distal end 122 of the upper plunger 120.

As illustrated in FIG. 9, the movable pedestal 300 on which the IC package 30 is placed is pushed toward the housing 200 side. At this time, the solder ball 31 comes into contact with the distal end 122 of the upper plunger 120 and further pushes the upper plunger 120 into the barrel 110. In this state, the upper plunger 120 is pushed by the spring 140, and thereby, the IC package 30 is attached to the socket 10 in a state where suitable contact force is applied to the solder ball 31.

When the movable pedestal 300 is pushed toward the housing 200 side, the upper plunger 120 is guided by the guide part 311 formed in the receiving hole 310. Thus, if the upper plunger 120 is inclined relative to the receiving hole 310 or the solder ball 31, the inclination is corrected.

As set forth, the socket 10 is mounted on the printed wiring board 20, the IC package 30 is attached to the socket 10, and then inspection of the IC package 30 is performed.

According to the present embodiment, the following advantageous effects are achieved.

The socket 10 includes: the so-called both-movable type contact probe 100A having the barrel 110 provided with the flange 114, the upper plunger 120, the lower plunger 130, and the spring 140; the housing 200 having the stepped hole 210 through which the contact probe 100A is inserted and in which the step 211 configured to abut against the flange 114 in the axis line X direction is formed; and the movable pedestal 300 provided so as to be able to come closer to and move away from the housing 200 and having the receiving hole 310 through which the distal end 122 side of the upper plunger 120 projecting from the barrel 110 is inserted and which receives the solder ball 31 of the IC package 30. Therefore, the barrel 110 including the whole flange 114 is pushed down by the stepped hole 210 formed in the housing 200, and thereby, a preload can be applied to the printed wiring board 20. At this time, since the position of the step 211 in the stepped hole 210 does not depend on the longitudinal dimension of the barrel 110, it is possible to increase the thickness dimension of the housing 200 of a portion to press the flange 114 by adjusting the position of the step 211 to a desired position. This can suppress the housing 200 from deforming due to reaction force against the preload. Further, since the position of the step 211 in the stepped hole 210 corresponds to the position of the flange 114 and does not depend on the longitudinal dimension of the barrel 110, it is possible to reduce the thickness of the housing 200 and increase the thickness of the movable pedestal 300 accordingly. Thus, a sufficient thickness dimension to form the guide part 311 can be ensured for the movable pedestal 300.

Further, since the guide part 311 whose inner diameter is substantially the same as the outer diameter of the portion of the upper plunger 120 projecting from the barrel 110 is formed in the receiving hole 310 of the movable pedestal 300, inclination of the upper plunger 120 can be corrected. This can stabilize contact between the upper plunger 120 and the solder ball 31 in the receiving hole 310.

Further, since the counterbore 312 that receives the barrel 110 projecting from the housing 200 is formed in the receiving hole 310 of the movable pedestal 300, it is possible to avoid interference between the barrel 110 and the movable pedestal 300 that may occur when the movable pedestal 300 comes close to the housing 200.

Further, the counterbore 312 may be formed integrally and continuously with adjacent another counterbore 312, and a plurality of counterbores 312 can be formed together at once. Accordingly, the counterbores 312 can be efficiently formed.

First Modified Example

Figure 13:
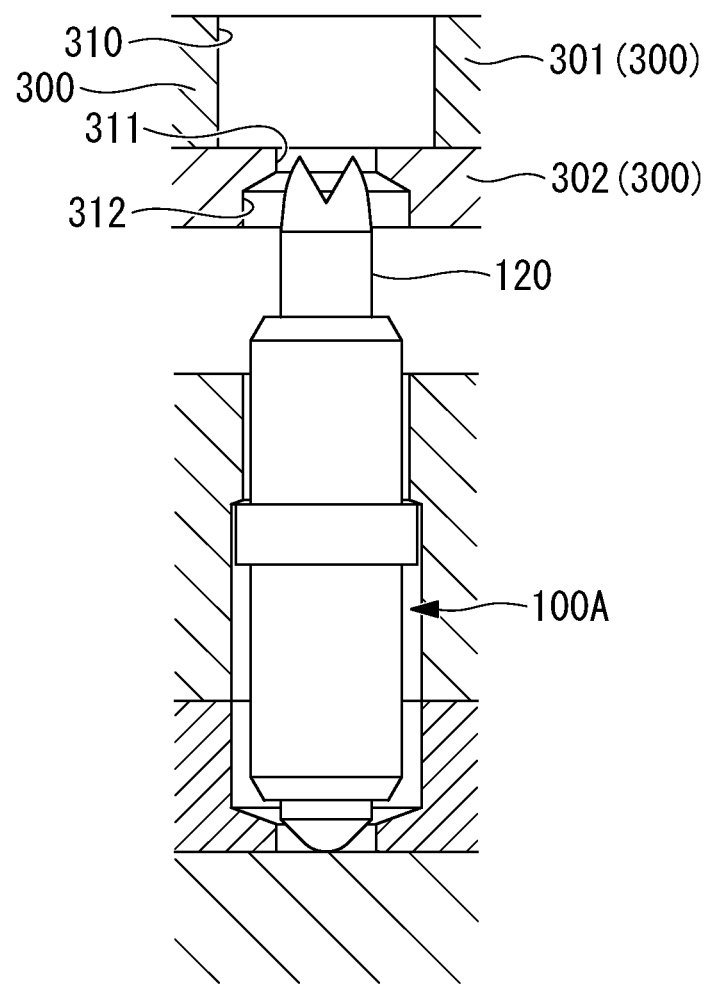
FIG. 13 is a partial enlarged view according to a first modified example of the part A illustrated in FIG. 1, which is a diagram illustrating a state after the socket has been mounted on the printed wiring board and before an IC package is placed on a movable pedestal.

As illustrated in FIG. 13, the movable pedestal 300 may be divided into two components of an upper pedestal 301 and a lower pedestal 302 in the direction of the axis line X. In such a case, the receiving hole 310 is formed so as to be continuous over both the components of the upper pedestal 301 and the lower pedestal 302, and the guide part 311 and the counterbore 312 are formed in the lower pedestal 302.

According to such a configuration, it is possible to form one movable pedestal 300 by combining the back surfaces of the upper pedestal 301 and the lower pedestal 302 to each other, which have been processed from the front surfaces, for example, without performing processing such as drilling from both the surfaces on one component forming one movable pedestal 300. This can improve the processing efficiency.

Second Embodiment

A socket for inspection according to a second embodiment of the present invention will be described below with reference to the drawings.

Note that the socket for inspection according to the present embodiment differs from the socket for inspection according to the first embodiment in the shape of the upper plunger and the shape of the receiving hole, and other features are the same. Thus, the same features are labeled with the same references, and the description thereof will be omitted.

Figure 14:
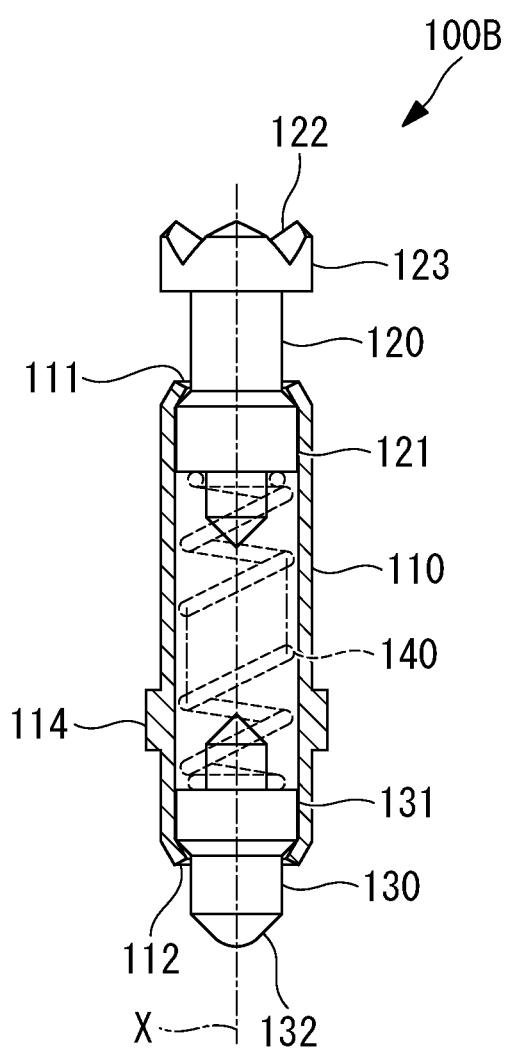
FIG. 14 is a vertical sectional view of a contact probe according to a second embodiment.

As illustrated in FIG. 14, a contact probe 100B is a so-called big head type probe, an expanded-diameter terminal part 123 is provided to the distal end 122 of the upper plunger 120.

Figure 15:
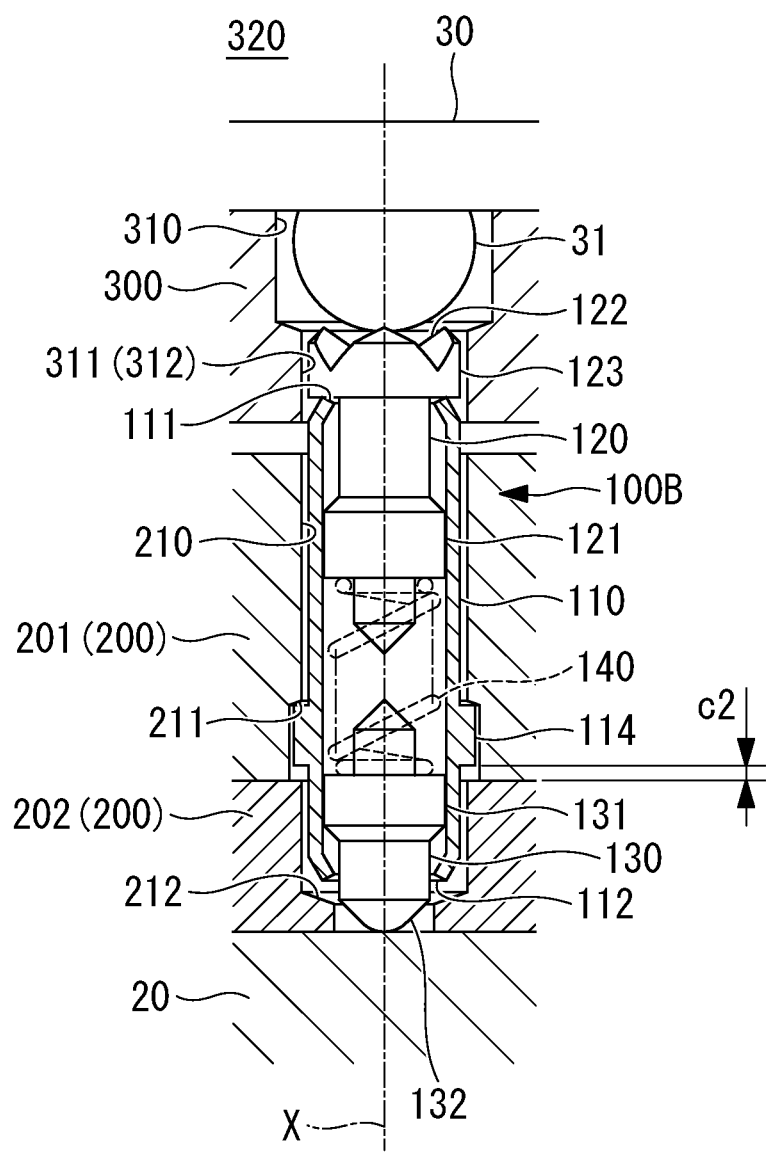
FIG. 15 is a partial enlarged view according to the second embodiment of the part A illustrated in FIG. 1, which is a diagram illustrating a state after the socket has been mounted on the printed wiring board and the IC package has been attached to the movable pedestal.

The outer diameter of the expanded-diameter terminal part 123 is substantially the same as the outer diameter of other portions than the flange 114 of the barrel 110. Accordingly, as illustrated in FIG. 15, different diameters are no longer required for the guide part 311 and the counterbore 312 formed in the receiving hole 310, and the guide part 311 and the counterbore 312 can be formed as the same portion.

The upper plunger 120 provided with the expanded-diameter terminal part 123 is set to have a longitudinal dimension such that the under surface of the expanded-diameter terminal part 123 positively abuts against the upper end 111 of the barrel 110 when the upper plunger 120 is pushed into the barrel 110 by the solder ball 31 during inspection. This can suppress the upper plunger 120 from being unstable relative to the barrel 110 and maintain a good contact state. Further, the whole portion below the expanded-diameter terminal part 123 of the upper plunger 120 can be hidden inside the barrel 110, and impedance mismatch can be removed.

A clearance c2 is provided between the upper plunger 120 formed as described above and the housing 200 on the under surface side of the flange 114 formed to the barrel 110. Accordingly, a margin by which the barrel 110 can be further pushed downward is secured to avoid mechanical constraint of the barrel 110.

According to the present embodiment, the following advantageous effects are achieved.

Since the expanded-diameter terminal part 123 having substantially the same diameter as the barrel 110 is provided to the distal end 122 in the upper plunger 120, the guide part 311 and the counterbore 312 formed in the receiving hole 310 can be formed as the same portion.

Further, since the upper plunger 120 is set to have the longitudinal dimension so that the expanded-diameter terminal part 123 abuts against the upper end 111 of the barrel 110 during inspection, the expanded-diameter terminal part 123 is stably in contact with the upper end 111 of the barrel 110 during inspection. This can stabilize a contact resistance between the upper plunger 120 and the barrel 110.

Furthermore, according to such a configuration, the whole portion except for the expanded-diameter terminal part 123 of the upper plunger 120 is accommodated in the barrel 110 (hidden in appearance) during inspection. Accordingly, during inspection, the contact probe 100B has substantially the same diameter as a whole, and impedance mismatch can be further removed.

Second Modified Example

Figure 16:
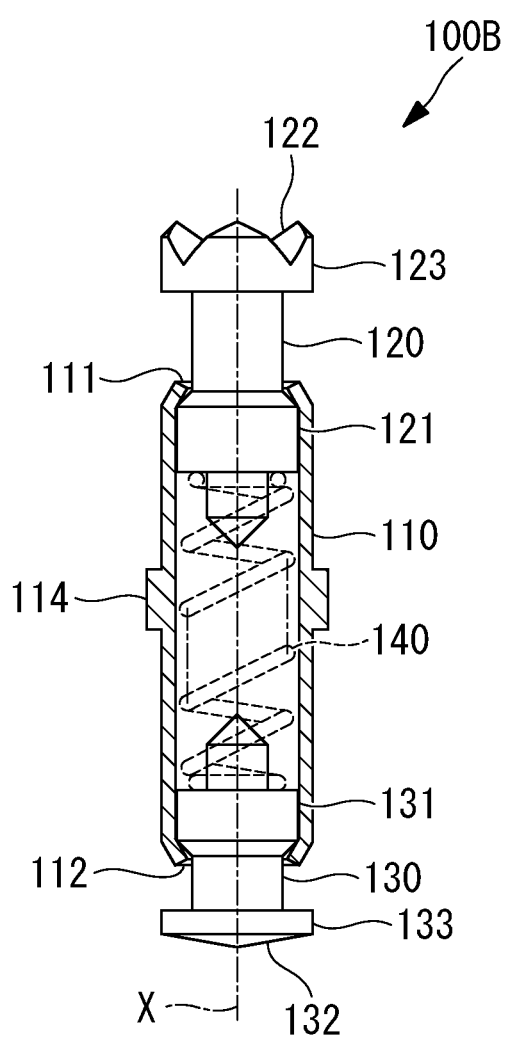
FIG. 16 is a vertical sectional view of a contact probe according to a second modified example.
Figure 17:
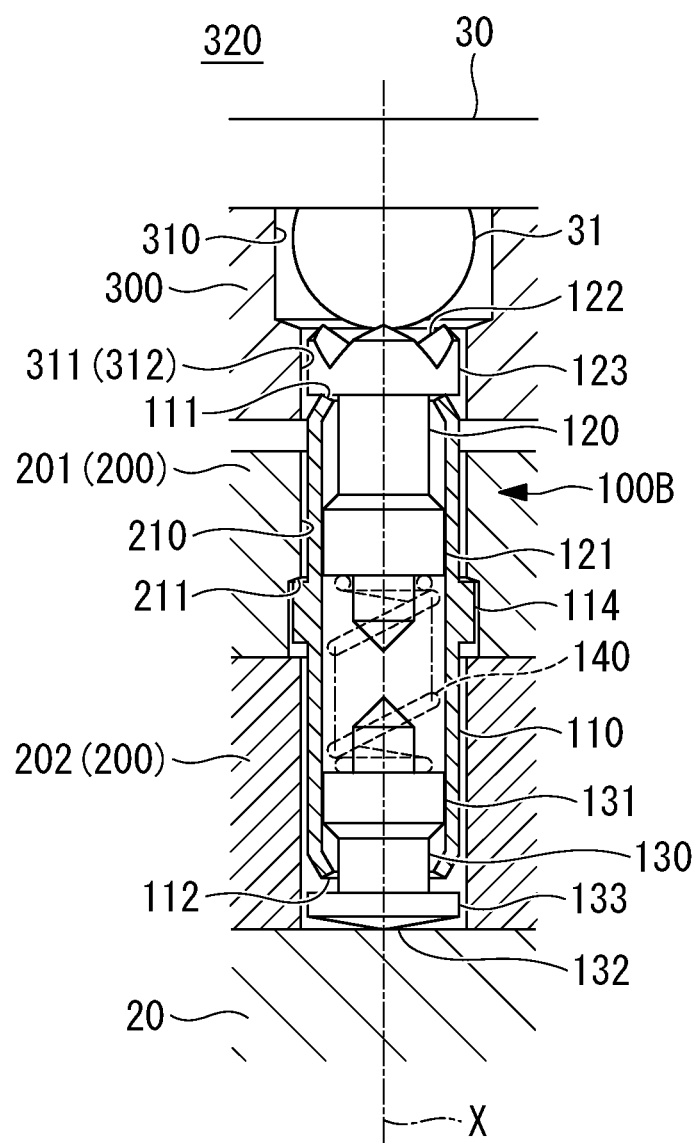
FIG. 17 is a partial enlarged view according to the second modified example of the part A illustrated in FIG. 1, which is a diagram illustrating a state after the socket has been mounted on the printed wiring board and the IC package has been attached to the movable pedestal.

As illustrated in FIG. 16, an expanded-diameter terminal part 133 may be provided also to the distal end 132 of the lower plunger 130.

According to such a configuration, the contact probe 100B can be close to a shape having substantially the same diameter as a whole, and impedance mismatch can be removed during inspection similarly to the upper plunger 120.

Third Embodiment

A socket for inspection according to a third embodiment of the present invention will be described below with reference to the drawings.

Note that the socket for inspection according to the present embodiment differs from the socket for inspection according to the first embodiment in the shape of the receiving hole, and other features are the same. Thus, the same features are labeled with the same references, and the description thereof will be omitted.

Figure 18:
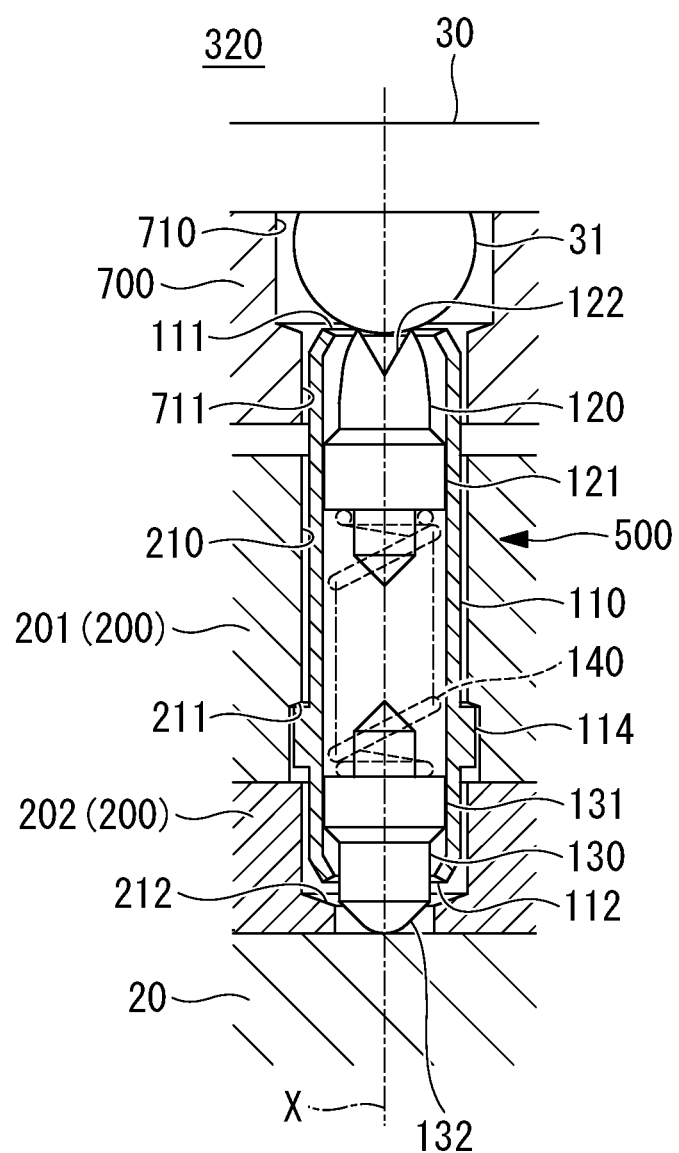
FIG. 18 is a partial enlarged view according to a third embodiment of the part A illustrated in FIG. 1, which is a diagram illustrating a state after the socket has been mounted on the printed wiring board and the IC package has been attached to the movable pedestal.

As illustrated in FIG. 18, a receiving hole 710 is formed along the axis line X direction in a movable pedestal 700.

The distal end 122 side of the upper plunger 120 is inserted through the receiving hole 710, and the solder ball 31 of the IC package 30 placed on the movable pedestal 700 is received therein (see FIG. 8 and FIG. 9). Further, the solder ball 31 is positioned by the receiving hole 710.

A guide part 711 is formed in the receiving hole 710 hollowed in the movable pedestal 700.

The guide part 711 is a portion formed to the lower part of the receiving hole 710, and the inner diameter thereof is substantially the same as (to be exact, slightly larger than) the outer diameter of other portions than the flange 114 of the barrel 110. Thereby, the portion of the barrel 110 projecting from the upper housing 201 can be guided.

The upper plunger 120 is set to have a longitudinal dimension such that the distal end 122 is accommodated in the barrel 110 when the upper plunger 120 is pushed into the barrel 110 by the solder ball 31 during inspection. Accordingly, the whole upper plunger 120 can be hidden inside the barrel 110.

According to the present embodiment, the following advantageous effect is achieved.

The whole upper plunger 120 is accommodated in the barrel 110 (hidden in appearance) during inspection. Thus, during inspection, the contact probe 500 has substantially the same diameter as a whole, and impedance mismatch can be removed.

LIST OF REFERENCES 10 socket (socket for inspection)
20 printed wiring board (test board)
30 IC package (device to be inspected)
31 solder ball (electrode)
100A, 100B contact probe (contact terminal)
110 barrel
111 upper end (one end)
112 lower end (the other end)
114 flange
120 upper plunger (device side terminal)
121 base end
122 distal end
123 expanded-diameter terminal part
130 lower plunger (test board side terminal)
131 base end
132 distal end
133 expanded-diameter terminal part
140 spring
200 housing
201 upper housing
202 lower housing
210 stepped hole
211 step
212 reduced-diameter part
300 movable pedestal
301 upper pedestal
302 lower pedestal
310 receiving hole
311 guide part
312 counterbore
320 recess
401 spring for pedestal
500 contact probe (contact terminal)
700 movable pedestal
710 receiving hole
711 guide part

What is claimed is:

1. A socket for inspection comprising:
a contact terminal having a barrel formed of a cylindrical member extending along an axis line direction and provided with a flange formed of an outer circumferential surface of the cylindrical member protruding in a radial direction, a device side terminal having a base end accommodated in one end side of the barrel and a distal end configured to come into contact with a device to be inspected, a test board side terminal having a base end accommodated in the other end side of the barrel and a distal end configured to come into contact with a test board, and a spring in contact with the test board side terminal and the device side terminal in the barrel;
a housing having a stepped hole through which the contact terminal is inserted along the axis line direction and in which a step configured to abut against the flange in the axis line direction is formed; and
a movable pedestal provided so as to be able to come closer to and move away from the housing and having a receiving hole through which the distal end of the device side terminal projecting from the barrel is inserted and which receives an electrode of the device to be inspected,
wherein a guide part is formed in the receiving hole of the movable pedestal, and the guide part has an inner diameter that is substantially the same as an outer diameter of a portion of the device side terminal projecting from the barrel, and
wherein a counterbore that receives the barrel projecting from the housing is formed in the receiving hole of the movable pedestal.

2. The socket for inspection according to claim 1, wherein the counterbore is formed integrally and continuously with another counterbore adjacent to the counterbore.

3. The socket for inspection according to claim 2, wherein an expanded-diameter terminal part having substantially the same diameter as the barrel is provided to a distal end in the device side terminal.

4. The socket for inspection according to claim 3, wherein the device side terminal is set to have a longitudinal dimension so that the expanded-diameter terminal part comes into contact with the one end of the barrel during inspection.

5. The socket for inspection according to claim 2, wherein an expanded-diameter terminal part having substantially the same diameter as the barrel is provided to distal ends in the device side terminal and the test board side terminal.

6. A socket for inspection comprising:
a contact terminal having a barrel formed of a cylindrical member extending along an axis line direction and provided with a flange formed of an outer circumferential surface of the cylindrical member protruding in a radial direction, a device side terminal having a base end accommodated in one end side of the barrel and a distal end configured to come into contact with a device to be inspected, a test board side terminal having a base end accommodated in the other end side of the barrel and a distal end configured to come into contact with a test board, and a spring in contact with the test board side terminal and the device side terminal in the barrel;

a housing having a stepped hole through which the contact terminal is inserted along the axis line direction and in which a step configured to abut against the flange in the axis line direction is formed; and a movable pedestal provided so as to be able to come closer to and move away from the housing and having a receiving hole through which the distal end of the device side terminal projecting from the barrel is inserted and which receives an electrode of the device to be inspected, wherein a guide part is formed in the receiving hole of the movable pedestal, and the guide part has an inner diameter that is substantially the same as an outer diameter of a portion of the device side terminal projecting from the barrel, and wherein the movable pedestal is divided in the axis line direction.

* * * * *